US010685660B2

(12) United States Patent
Liu et al.

(10) Patent No.: US 10,685,660 B2
(45) Date of Patent: *Jun. 16, 2020

(54) VOICE AUDIO ENCODING DEVICE, VOICE AUDIO DECODING DEVICE, VOICE AUDIO ENCODING METHOD, AND VOICE AUDIO DECODING METHOD

(71) Applicant: Fraunhofer-Gesellschaft zur Foerderung der angewandten Forschung e.V., Munich (DE)

(72) Inventors: Zongxian Liu, Singapore (SG); Srikanth Nagisetty, Singapore (SG); Masahiro Oshikiri, Osaka (JP)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/141,934

(22) Filed: Sep. 25, 2018

(65) Prior Publication Data

US 2019/0027155 A1 Jan. 24, 2019

Related U.S. Application Data

(63) Continuation of application No. 15/673,957, filed on Aug. 10, 2017, now Pat. No. 10,102,865, which is a (Continued)

(30) Foreign Application Priority Data

Dec. 13, 2012 (JP) ................................ 2012-272571

(51) Int. Cl.

| | |
|---|---|
| *H03M 7/30* | (2006.01) |
| *G10L 19/02* | (2013.01) |
| *G10L 19/035* | (2013.01) |

(52) U.S. Cl.

CPC ........ *G10L 19/0204* (2013.01); *G10L 19/035* (2013.01)

(58) Field of Classification Search

None

See application file for complete search history.

(56) References Cited

U.S. PATENT DOCUMENTS 4,899,384 A * 2/1990 Crouse .................. H04B 1/667 375/240
5,222,189 A * 6/1993 Fielder .................... G06T 9/005 704/229

(Continued)

FOREIGN PATENT DOCUMENTS

CN 1195160 A 10/1998
CN 1196611 A 10/1998

(Continued)

OTHER PUBLICATIONS

English translation of the Chinese Search Report which is an annex to the Chinese Office Action dated Jan. 10, 2017 issued by the Chinese Patent Office in Chinese Patent Application No. 201380063794.

(Continued)

*Primary Examiner* — Seong-Ah A Shin
(74) *Attorney, Agent, or Firm* — Michael A. Glenn; Perkins Coie LLP

(57) ABSTRACT

Provided are a voice audio encoding device, voice audio decoding device, voice audio encoding method, and voice audio decoding method that efficiently perform bit distribution and improve sound quality. Dominant frequency band identification unit identifies a dominant frequency band having a norm factor value that is the maximum value within the spectrum of an input voice audio signal. Dominant group determination units and non-dominant group determination unit group all sub-bands into a dominant group that contains the dominant frequency band and a non-dominant group that (Continued)

contains no dominant frequency band. Group bit distribution unit distributes bits to each group on the basis of the energy and norm variance of each group. Sub-band bit distribution unit redistributes the bits that have been distributed to each group to each sub-band in accordance with the ratio of the norm to the energy of the groups.

25 Claims, 9 Drawing Sheets

Related U.S. Application Data continuation of application No. 14/650,093, filed as application No. PCT/JP2013/006948 on Nov. 26, 2013, now Pat. No. 9,767,815.

(56) References Cited

U.S. PATENT DOCUMENTS

| | | | | |
|---|---|---|---|---|
| 5,893,065 | A * | 4/1999 | Fukuchi | G10L 19/0204 704/229 |
| 5,930,750 | A * | 7/1999 | Tsutsui | G06T 9/005 704/200.1 |
| 6,108,625 | A | 8/2000 | Kim | |
| 6,122,618 | A | 9/2000 | Park | |
| 6,246,345 | B1 | 6/2001 | Davidson et al. | |
| 6,246,945 | B1 * | 6/2001 | Fritz | B60K 31/047 303/112 |
| 6,456,968 | B1 * | 9/2002 | Taniguchi | G06T 9/007 704/229 |
| 6,487,535 | B1 | 11/2002 | Smyth et al. | |
| 8,352,258 | B2 | 1/2013 | Yamanashi et al. | |
| 8,942,989 | B2 | 1/2015 | Liu et al. | |
| 9,105,263 | B2 * | 8/2015 | Qi | G10L 19/032 |
| 2005/0267744 | A1 * | 12/2005 | Nettre | G10L 19/032 704/222 |
| 2007/0168186 | A1 | 7/2007 | Ide | |
| 2008/0120095 | A1 | 5/2008 | Oh et al. | |
| 2010/0070269 | A1 * | 3/2010 | Gao | G10L 19/24 704/207 |
| 2010/0161320 | A1 * | 6/2010 | Kim | G10L 19/0208 704/203 |
| 2010/0211400 | A1 | 8/2010 | Oh et al. | |
| 2011/0202354 | A1 | 8/2011 | Grill et al. | |
| 2012/0004918 | A1 | 1/2012 | Feng et al. | |
| 2012/0029923 | A1 | 2/2012 | Rajendran et al. | |
| 2012/0029925 | A1 * | 2/2012 | Duni | G10L 19/038 704/500 |
| 2012/0226505 | A1 * | 9/2012 | Lin | G10L 19/002 704/500 |
| 2012/0288117 | A1 | 11/2012 | Kim et al. | |
| 2013/0030796 | A1 | 1/2013 | Liu | |
| 2013/0173275 | A1 | 7/2013 | Liu et al. | |
| 2013/0339012 | A1 * | 12/2013 | Kawashima | G10L 19/12 704/219 |
| 2013/0339038 | A1 * | 12/2013 | Norvell | G10L 19/0204 704/500 |
| 2014/0114651 | A1 * | 4/2014 | Liu | G10L 19/0212 704/203 |
| 2014/0249806 | A1 * | 9/2014 | Liu | G10L 19/035 704/206 |
| 2015/0025879 | A1 | 1/2015 | Liu et al. | |
| 2015/0317991 | A1 * | 11/2015 | Liu | G10L 19/035 704/205 |
| 2016/0275955 | A1 * | 9/2016 | Liu | G10L 19/002 |
| 2017/0076728 | A1 * | 3/2017 | Kawashima | G10L 19/06 |
| 2017/0345431 | A1 * | 11/2017 | Liu | G10L 19/035 |

FOREIGN PATENT DOCUMENTS

| | | | |
|---|---|---|---|
| CN | 101548316 | A | 9/2009 |
| EP | 0259553 | A2 | 3/1988 |
| EP | 2333960 | A1 | 6/2011 |
| JP | 63-58500 | A | 3/1988 |
| JP | 2000-338998 | A | 12/2000 |
| JP | 2001044844 | A | 2/2001 |
| JP | 2002542522 | A | 12/2002 |
| JP | 2009063623 | A | 3/2009 |
| RU | 2010125251 | A | 12/2011 |
| RU | 2449387 | C2 | 4/2012 |
| RU | 2010154747 | A | 7/2012 |
| RU | 2485606 | C2 | 6/2013 |
| WO | 2012016126 | A2 | 2/2012 |
| WO | 2012144128 | A1 | 10/2012 |

OTHER PUBLICATIONS

Extended European Search Report (EESR) issued by the European Patent Office (EPO) in European Patent Application No. 13862073.7, dated Dec. 10, 2015.

International Search Report (ISR) in International Patent Application No. PCT/JP2013/006948, dated Mar. 4, 2014.

ITU-T, "G.719: Low-complexity, full-band audio coding for high-quality, conversational applications", Recommendation ITU-T G.719, Telecommunication Standardization Sector of ITU, Jun. 2008, 58 pages.

Xie, Minjie et al., "ITU-T G.719: A New Low-Complexity Full-Band (20 KHZ) Audio Coding Standard for High-Quality Conversational Applications", New Paltz, New York, 2009 IEEE Workshop on Applications of Signal Processing to Audio and Acoustics., Aug. 21, 2019.

* cited by examiner

| GROUP | LENGTH OF SUB-VECTOR | NUMBER OF SUB-VECTORS | NUMBER OF COEFFICIENTS | BAND WIDTH (Hz) | START (Hz) | END (Hz) |
|---|---|---|---|---|---|---|
| I | 8 | 16 | 128 | 3 200 | 0 | 3 200 |
| II | 16 | 8 | 128 | 3 200 | 3 200 | 6 400 |
| III | 24 | 12 | 288 | 7 200 | 6 400 | 13 600 |
| IV | 32 | 8 | 256 | 6 400 | 13 600 | 20 000 |
| TOTAL | | 44 | 800 | 20 000 | | |

FIG. 3

VOICE AUDIO ENCODING DEVICE, VOICE AUDIO DECODING DEVICE, VOICE AUDIO ENCODING METHOD, AND VOICE AUDIO DECODING METHOD

CROSS-REFERENCE TO RELATED APPLICATIONS

This application is a continuation of U.S. patent application Ser. No. 15/673,957 filed Aug. 10, 2017, which is a continuation of U.S. patent application Ser. No. 14/650,093 filed Jun. 5, 2015 (now U.S. Pat. No. 9,767,815 issued Sep. 19, 2018), which is a National State Entry of International Application No. PCT/JP2013/006948, filed Nov. 26, 2013, and additionally claims priority from Japanese Application No. JP 2012-272571, filed Dec. 13, 2012, all of which are incorporated herein by reference in their entirety.

The present invention relates to a speech/audio coding apparatus, a speech/audio decoding apparatus, a speech/audio coding method and a speech/audio decoding method using a transform coding scheme.

BACKGROUND OF THE INVENTION

As a scheme capable of efficiently encoding a speech signal or music signal in a full band (FB) of 0.02 to 20 kHz, there is a technique standardized in ITU-T (International Telecommunication Union Telecommunication Standardization Sector). This technique transforms an input signal into a frequency-domain signal and encodes a band of up to 20 kHz (transform coding).

Here, transform coding is a coding scheme that transforms an input signal from a time domain into a frequency domain using time/frequency transformation such as discrete cosine transform (DCT) or modified discrete cosine transform (MDCT) to enable a signal to be mapped in precise correspondence with auditory characteristics.

In transform coding, a spectral coefficient is split into a plurality of frequency subbands. In coding of each subband, allocating more quantization bits to a band which is perceptually important to human ears makes it possible to improve overall sound quality.

In order to attain this object, studies are being carried out on efficient bit allocation schemes, and for example, a technique disclosed in Non-Patent Literature (hereinafter, referred to as "NPL") 1 is known. Hereinafter, the bit allocation scheme disclosed in Patent Literature (hereinafter, referred to as "PTL") 1 will be described using FIG. 1 and FIG. 2.

FIG. 1 is a block diagram illustrating a configuration of a speech/audio coding apparatus disclosed in PTL 1. An input signal sampled at 48 kHz is inputted to transient detector 11 and transformation section 12 of the speech/audio coding apparatus.

Transient detector 11 detects, from the input signal, either a transient frame corresponding to a leading edge or an end edge of speech or a stationary frame corresponding to a speech section other than that, and transformation section 12 applies, to the frame of the input signal, high-frequency resolution transformation or low-frequency resolution transformation depending on whether the frame detected by transient detector 11 is a transient frame or stationary frame, and acquires a spectral coefficient (or transform coefficient).

Norm estimation section 13 splits the spectral coefficient obtained in transformation section 12 into bands of different bandwidths. Norm estimation section 13 estimates a norm (or energy) of each split band.

Norm quantization section 14 determines a spectral envelope made up of the norms of all bands based on the norm of each band estimated by norm estimation section 13 and quantizes the determined spectral envelope.

Spectrum normalization section 15 normalizes the spectral coefficient obtained by transformation section 12 according to the norm quantized by norm quantization section 14.

Norm adjustment section 16 adjusts the norm quantized by norm quantization section 14 based on adaptive spectral weighting.

Bit allocation section 17 allocates available bits for each band in a frame using the quantization norm adjusted by norm adjustment section 16.

Lattice-vector coding section 18 performs lattice-vector coding on the spectral coefficient normalized by spectrum normalization section 15 using bits allocated for each band by bit allocation section 17.

Noise level adjustment section 19 estimates the level of the spectral coefficient before coding in lattice-vector coding section 18 and encodes the estimated level. A noise level adjustment index is obtained in this way.

Multiplexer 20 multiplexes a frame configuration of the input signal acquired by transformation section 12, that is, a transient signal flag indicating whether the frame is a stationary frame or transient frame, the norm quantized by norm quantization section 14, the lattice coding vector obtained by lattice-vector coding section 18 and the noise level adjustment index obtained by noise level adjustment section 19, and forms a bit stream and transmits the bit stream to a speech/audio decoding apparatus.

FIG. 2 is a block diagram illustrating a configuration of the speech/audio decoding apparatus disclosed in PTL 1. The speech/audio decoding apparatus receives the bit stream transmitted from the speech/audio coding apparatus and demultiplexer 21 demultiplexes the bit stream.

Norm de-quantization section 22 de-quantizes the quantized norm, acquires a spectral envelope made up of norms of all bands, and norm adjustment section 23 adjusts the norm de-quantized by norm de-quantization section 22 based on adaptive spectral weighting.

Bit allocation section 24 allocates available bits for each band in a frame using the norms adjusted by norm adjustment section 23. That is, bit allocation section 24 recalculates bit allocation indispensable to decode the lattice-vector code of the normalized spectral coefficient.

Lattice decoding section 25 decodes a transient signal flag, decodes the lattice coding vector based on a frame configuration indicated by the decoded transient signal flag and the bits allocated by bit allocation section 24 and acquires a spectral coefficient.

Spectral-fill generator 26 regenerates a low-frequency spectral coefficient to which no bit has been allocated using a codebook created based on the spectral coefficient decoded by lattice decoding section 25. Spectral-fill generator 26 adjusts the level of the spectral coefficient regenerated using a noise level adjustment index. Furthermore, spectral-fill generator 26 regenerates a high-frequency uncoded spectral coefficient using a low-frequency coded spectral coefficient.

Adder 27 adds up the decoded spectral coefficient and the regenerated spectral coefficient, and generates a normalized spectral coefficient.

Envelope shaping section 28 applies the spectral envelope de-quantized by norm de-quantization section 22 to the normalized spectral coefficient generated by adder 27 and generates a full-band spectral coefficient.

Inverse transformation section 29 applies inverse transform such as inverse modified discrete cosine transform (IMDCT) to the full-band spectral coefficient generated by envelope shaping section 28 to transform it into a time-domain signal. Here, inverse transform with high-frequency resolution is applied to a case with a stationary frame and inverse transform with low-frequency resolution is applied to a case with a transient frame.

In G.719, the spectral coefficients are split into spectrum groups. Each spectrum group is split into bands of equal length sub-vectors as shown in FIG. 3. Sub-vectors are different in length from one group to another and this length increases as the frequency increases.

Regarding transform resolution, higher frequency resolution is used for low frequencies, while lower frequency resolution is used for high frequencies. As described in G.719, the grouping allows an efficient use of the available bit-budget during encoding.

In G.719, the bit allocation scheme is identical in a coding apparatus and a decoding apparatus. Here, the bit allocation scheme will be described using FIG. 4.

As shown in FIG. 4, in step (hereinafter abbreviated as "ST") 31, quantized norms are adjusted prior to bit allocation to adjust psycho-acoustical weighting and masking effects.

In ST32, subbands having a maximum norm are identified from among all subbands and in ST33, one bit is allocated to each spectral coefficient for the subbands having the maximum norm. That is, as many bits as spectral coefficients are allocated.

In ST34, the norms are reduced according to the bits allocated, and in ST35, it is determined whether the remaining number of allocatable bits is 8 or more. When the remaining number of allocatable bits is 8 or more, the flow returns to ST32 and when the remaining number of allocatable bits is less than 8, the bit allocation procedure is terminated.

Thus, in the bit allocation scheme, available bits within a frame are allocated among subbands using the adjusted quantization norms. Normalized spectral coefficients are encoded by lattice-vector coding using the bits allocated to each subband.

NPL 1

ITU-T Recommendation G.719, "Low-complexity full-band audio coding for high-quality conversational applications," ITU-T, 2009.

However, the above bit allocation scheme does not take into consideration input signal characteristics when grouping spectral bands, and therefore has a problem in that efficient bit allocation is not possible and further improvement of sound quality cannot be expected.

SUMMARY

According to an embodiment, a speech/audio coding apparatus may have: a transformation section that transforms an input signal from a time domain to a frequency domain; an estimation section that estimates an energy envelope which represents an energy level for each of a plurality of subbands obtained by splitting a frequency spectrum of the input signal; a quantization section that quantizes the energy envelopes; a group determining section that groups the quantized energy envelopes into a plurality of groups; a first bit allocation section that allocates bits to the plurality of groups; a second bit allocation section that allocates the bits allocated to the plurality of groups to subbands on a group-by-group basis; and a coding section that encodes the frequency spectrum using bits allocated to the subbands.

According to another embodiment, a speech/audio decoding apparatus may have: a de-quantization section that de-quantizes a quantized spectral envelope; a group determining section that groups the quantized spectral envelopes into a plurality of groups; a first bit allocation section that allocates bits to the plurality of groups; a second bit allocation section that allocates the bits allocated to the plurality of groups to subbands on a group-by-group basis; a decoding section that decodes a frequency spectrum of a speech/audio signal using the bits allocated to the subbands; an envelope shaping section that applies the de-quantized spectral envelope to the decoded frequency spectrum and reproduces a decoded spectrum; and an inverse transformation section that inversely transforms the decoded spectrum from a frequency domain to a time domain.

According to another embodiment, a speech/audio coding method may have the steps of: transforming an input signal from a time domain to a frequency domain; estimating an energy envelope that represents an energy level for each of a plurality of subbands obtained by splitting a frequency spectrum of the input signal; quantizing the energy envelopes; grouping the quantized energy envelopes into a plurality of groups; allocating bits to the plurality of groups; allocating the bits allocated to the plurality of groups to subbands on a group-by-group basis; and encoding the frequency spectrum using bits allocated to the subbands.

According to another embodiment, a speech/audio decoding method may have the steps of: de-quantizing a quantized spectral envelope; grouping the quantized spectral envelope into a plurality of groups; allocating bits to the plurality of groups; allocating the bits allocated to the plurality of groups to subbands on a group-by-group basis; decoding a frequency spectrum of a speech/audio signal using the bits allocated to the subbands; applying the de-quantized spectral envelope to the decoded frequency spectrum and reproducing a decoded spectrum; and inversely transforming the decoded spectrum from a frequency domain to a time domain.

A speech/audio coding apparatus of the present invention includes: a transformation section that transforms an input signal from a time domain to a frequency domain; an estimation section that estimates an energy envelope which represents an energy level for each of a plurality of subbands obtained by splitting a frequency spectrum of the input signal; a quantization section that quantizes the energy envelopes; a group determining section that groups the quantized energy envelopes into a plurality of groups; a first bit allocation section that allocates bits to the plurality of groups; a second bit allocation section that allocates the bits allocated to the plurality of groups to subbands on a group-by-group basis; and a coding section that encodes the frequency spectrum using bits allocated to the subbands.

A speech/audio decoding apparatus according to the present invention includes: a de-quantization section that de-quantizes a quantized spectral envelope; a group determining section that groups the quantized spectral envelopes into a plurality of groups; a first bit allocation section that allocates bits to the plurality of groups; a second bit allocation section that allocates the bits allocated to the plurality of groups to subbands on a group-by-group basis; a decoding section that decodes a frequency spectrum of a speech/audio signal using the bits allocated to the subbands; an envelope shaping section that applies the de-quantized spectral envelope to the decoded frequency spectrum and reproduces a decoded spectrum; and an inverse transformation section that inversely transforms the decoded spectrum from a frequency domain to a time domain.

A speech/audio coding method according to the present invention includes: transforming an input signal from a time domain to a frequency domain; estimating an energy envelope that represents an energy level for each of a plurality of subbands obtained by splitting a frequency spectrum of the input signal; quantizing the energy envelopes; grouping the quantized energy envelopes into a plurality of groups; allocating bits to the plurality of groups; allocating the bits allocated to the plurality of groups to subbands on a group-by-group basis; and encoding the frequency spectrum using bits allocated to the subbands.

A speech/audio decoding method according to the present invention includes: de-quantizing a quantized spectral envelope; grouping the quantized spectral envelope into a plurality of groups; allocating bits to the plurality of groups; allocating the bits allocated to the plurality of groups to subbands on a group-by-group basis; decoding a frequency spectrum of a speech/audio signal using the bits allocated to the subbands; applying the de-quantized spectral envelope to the decoded frequency spectrum and reproducing a decoded spectrum; and inversely transforming the decoded spectrum from a frequency domain to a time domain.

According to the present invention, it is possible to realize efficient bit allocation and improve sound quality.

BRIEF DESCRIPTION OF THE DRAWINGS

Embodiments of the present invention will be detailed subsequently referring to the appended drawings, in which:

FIG. 3 is a diagram illustrating grouping of spectral coefficients in a stationary mode disclosed in PTL 1;

DETAILED DESCRIPTION OF THE INVENTION

Hereinafter, embodiments of the present invention will be described in detail with reference to the accompanying drawings.

Embodiment

Figure 1:
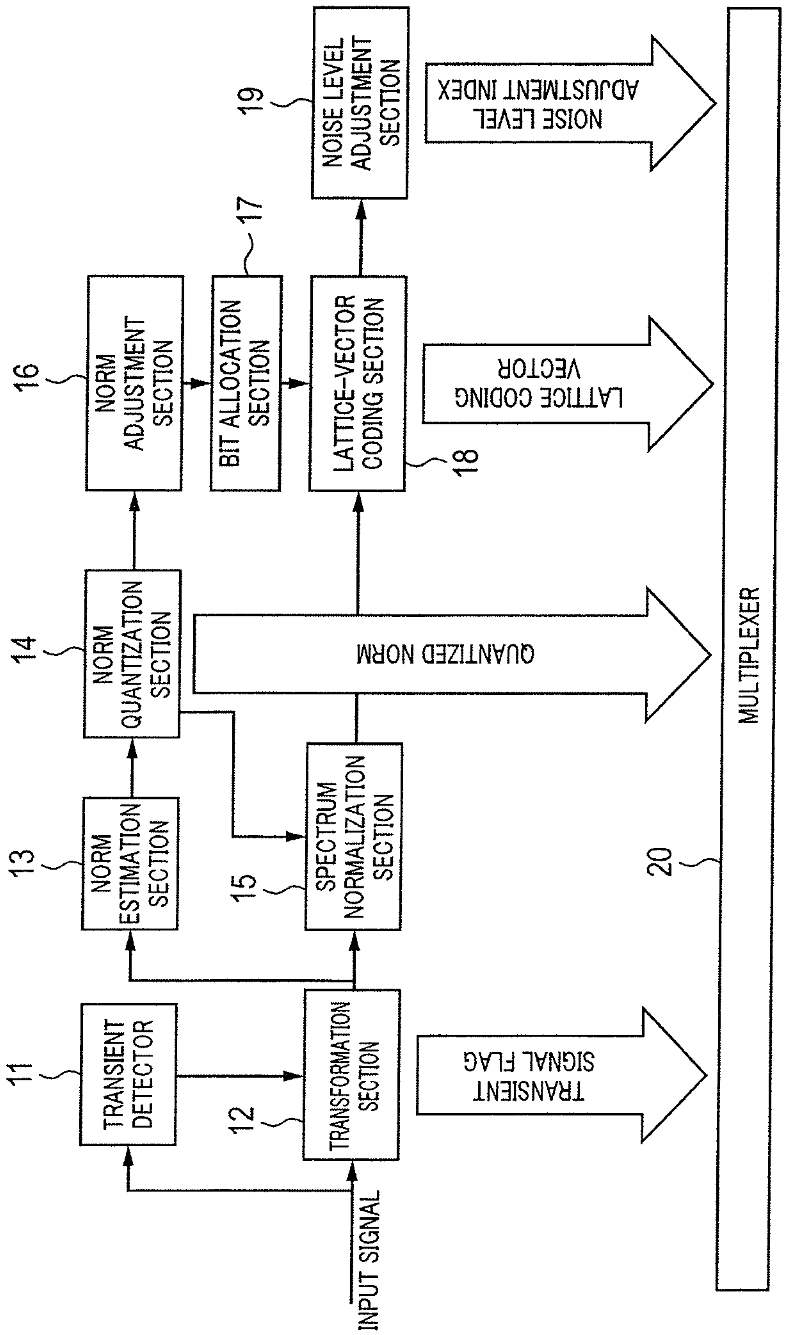
FIG. 1 is a block diagram illustrating a configuration of a speech/audio coding apparatus disclosed in PTL 1.
Figure 2:
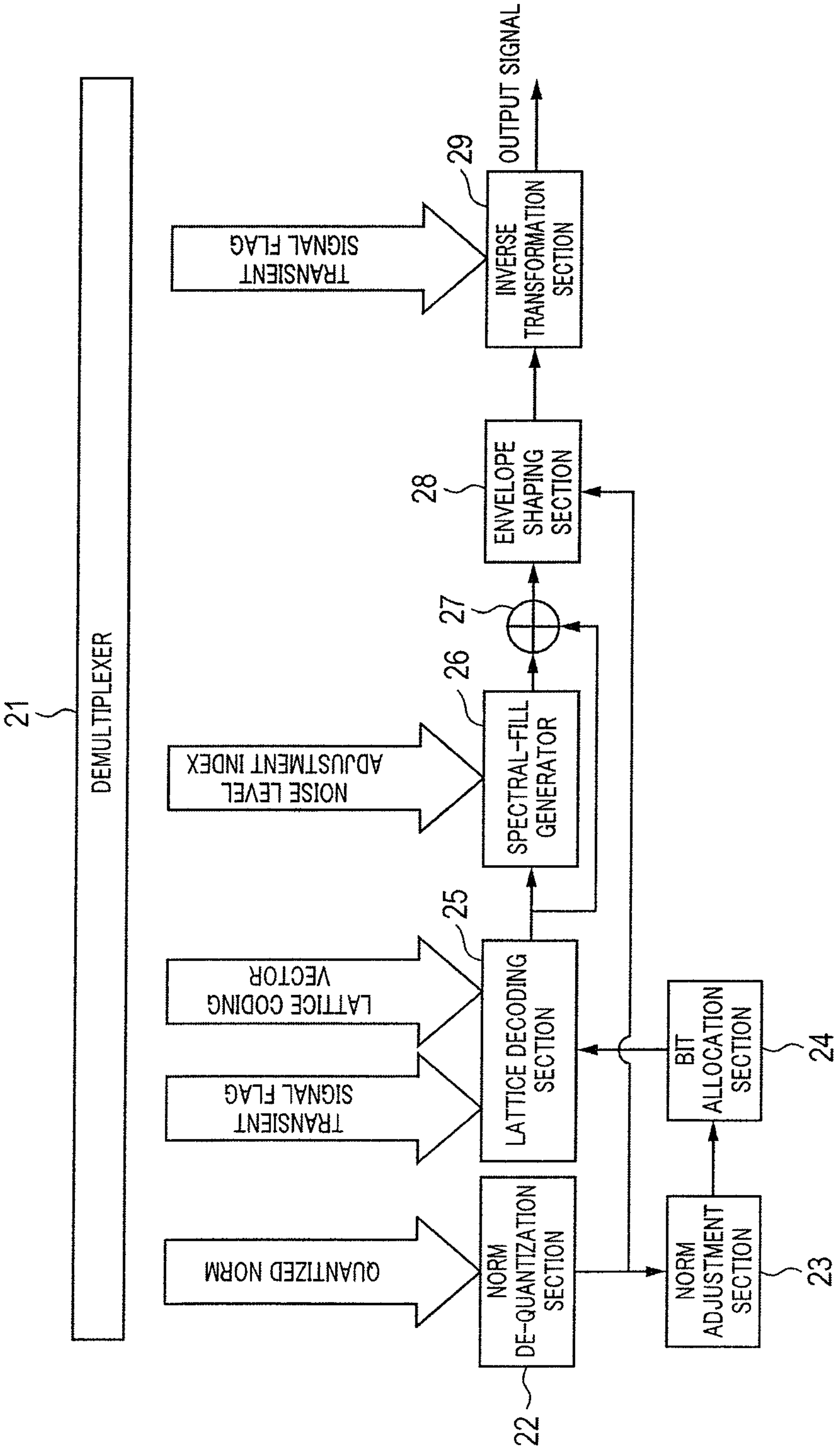
FIG. 2 is a block diagram illustrating a configuration of a speech/audio decoding apparatus disclosed in PTL 1.
Figure 4:
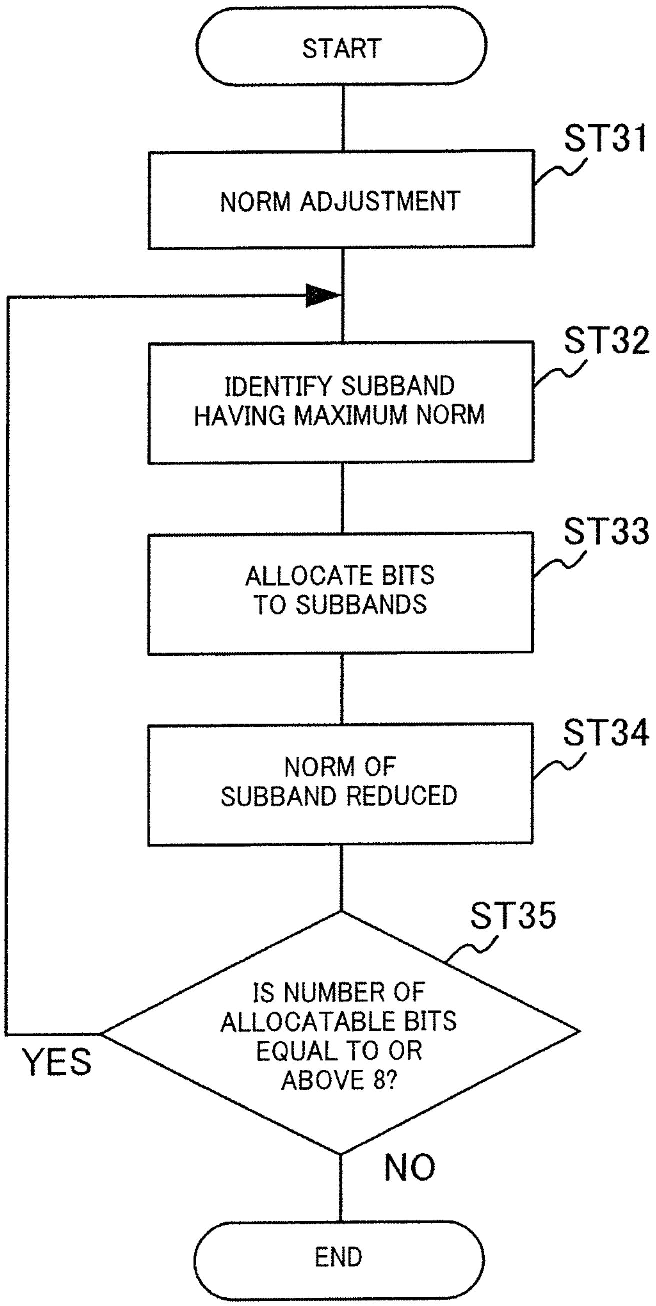
FIG. 4 is a flowchart illustrating a bit allocation scheme disclosed in PTL 1.
Figure 5:
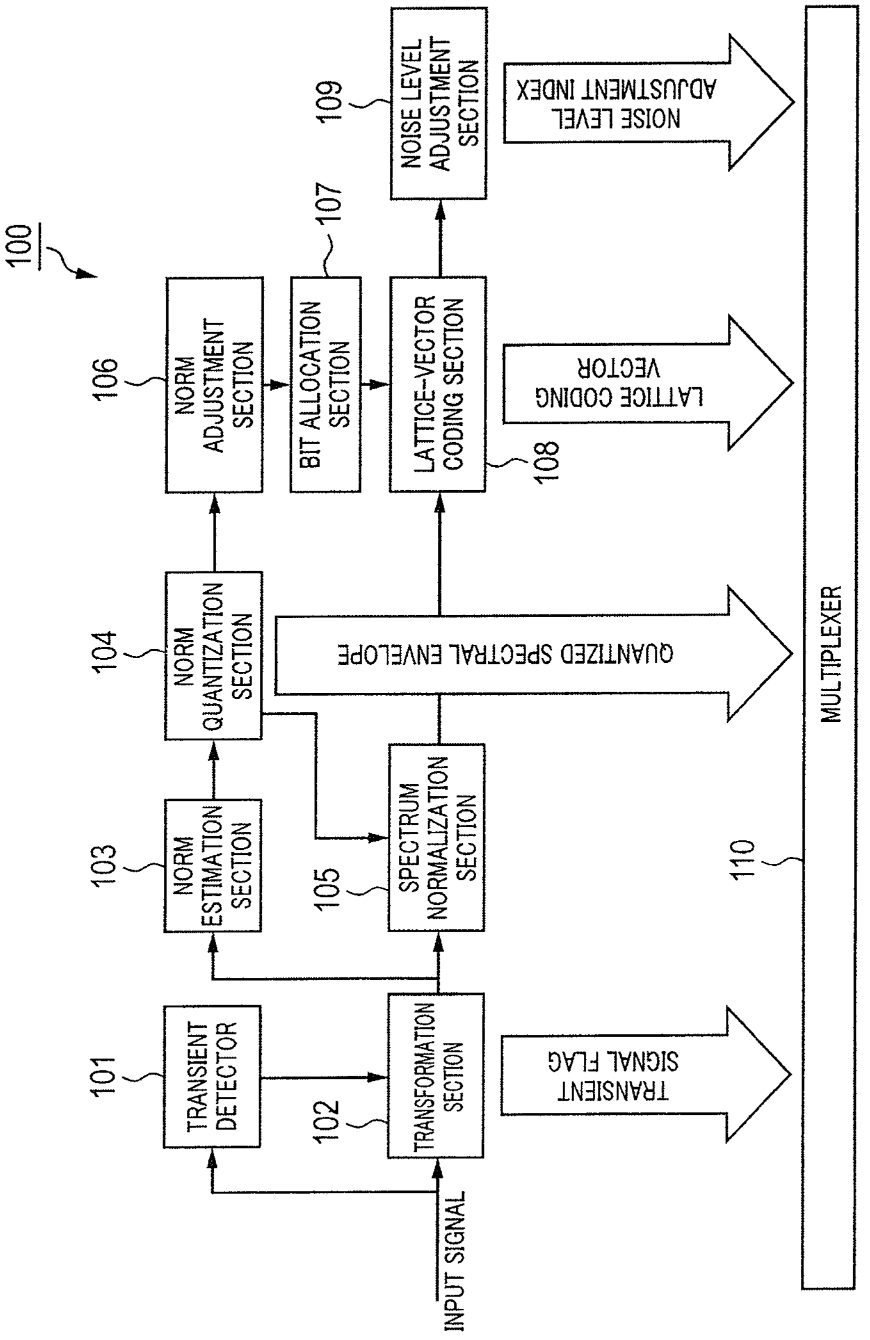
FIG. 5 is a block diagram illustrating a configuration of a speech/audio coding apparatus according to an embodiment of the present invention.

FIG. 5 is a block diagram illustrating a configuration of speech/audio coding apparatus 100 according to an embodiment of the present invention. An input signal sampled at 48 kHz is inputted to transient detector 101 and transformation section 102 of speech/audio coding apparatus 100.

Transient detector 101 detects, from an input signal, either a transient frame corresponding to a leading edge or an end edge of speech or a stationary frame corresponding to a speech section other than that, and outputs the detection result to transformation section 102. Transformation section 102 applies, to the frame of the input signal, high-frequency resolution transformation or low-frequency resolution transformation depending on whether the detection result outputted from transient detector 101 is a transient frame or stationary frame, and acquires a spectral coefficient (or transform coefficient) and outputs the spectral coefficient to norm estimation section 103 and spectrum normalization section 105. Transformation section 102 outputs a frame configuration which is the detection result outputted from transient detector 101, that is, a transient signal flag indicating whether the frame is a stationary frame or a transient frame to multiplexer 110.

Norm estimation section 103 splits the spectral coefficient outputted from transformation section 102 into bands of different bandwidths and estimates a norm (or energy) of each split band. Norm estimation section 103 outputs the estimated norm of each band to norm quantization section 104.

Norm quantization section 104 determines a spectral envelope made up of norms of all bands based on norms of respective bands outputted from norm estimation section 103, quantizes the determined spectral envelope and outputs the quantized spectral envelope to spectrum normalization section 105 and norm adjustment section 106.

Spectrum normalization section 105 normalizes the spectral coefficient outputted from transformation section 102 according to the quantized spectral envelope outputted from norm quantization section 104 and outputs the normalized spectral coefficient to lattice-vector coding section 108.

Norm adjustment section 106 adjusts the quantized spectral envelope outputted from norm quantization section 104 based on adaptive spectral weighting and outputs the adjusted quantized spectral envelope to bit allocation section 107.

Bit allocation section 107 allocates available bits for each band in a frame using the adjusted quantized spectral envelope outputted from norm adjustment section 106 and outputs the allocated bits to lattice-vector coding section 108. Details of bit allocation section 107 will be described later.

Lattice-vector coding section 108 performs lattice-vector coding on the spectral coefficient normalized by spectrum normalization section 105 using the bits allocated for each band in bit allocation section 107 and outputs the lattice coding vector to noise level adjustment section 109 and multiplexer 110.

Noise level adjustment section 109 estimates the level of the spectral coefficient prior to coding in lattice-vector coding section 108 and encodes the estimated level. A noise level adjustment index is determined in this way. The noise level adjustment index is outputted to multiplexer 110.

Multiplexer 110 multiplexes the transient signal flag outputted from transformation section 102, quantized spectral envelope outputted from norm quantization section 104, lattice coding vector outputted from lattice-vector coding section 108 and noise level adjustment index outputted from noise level adjustment section 109, and forms a bit stream and transmits the bit stream to a speech/audio decoding apparatus.

Figure 6:
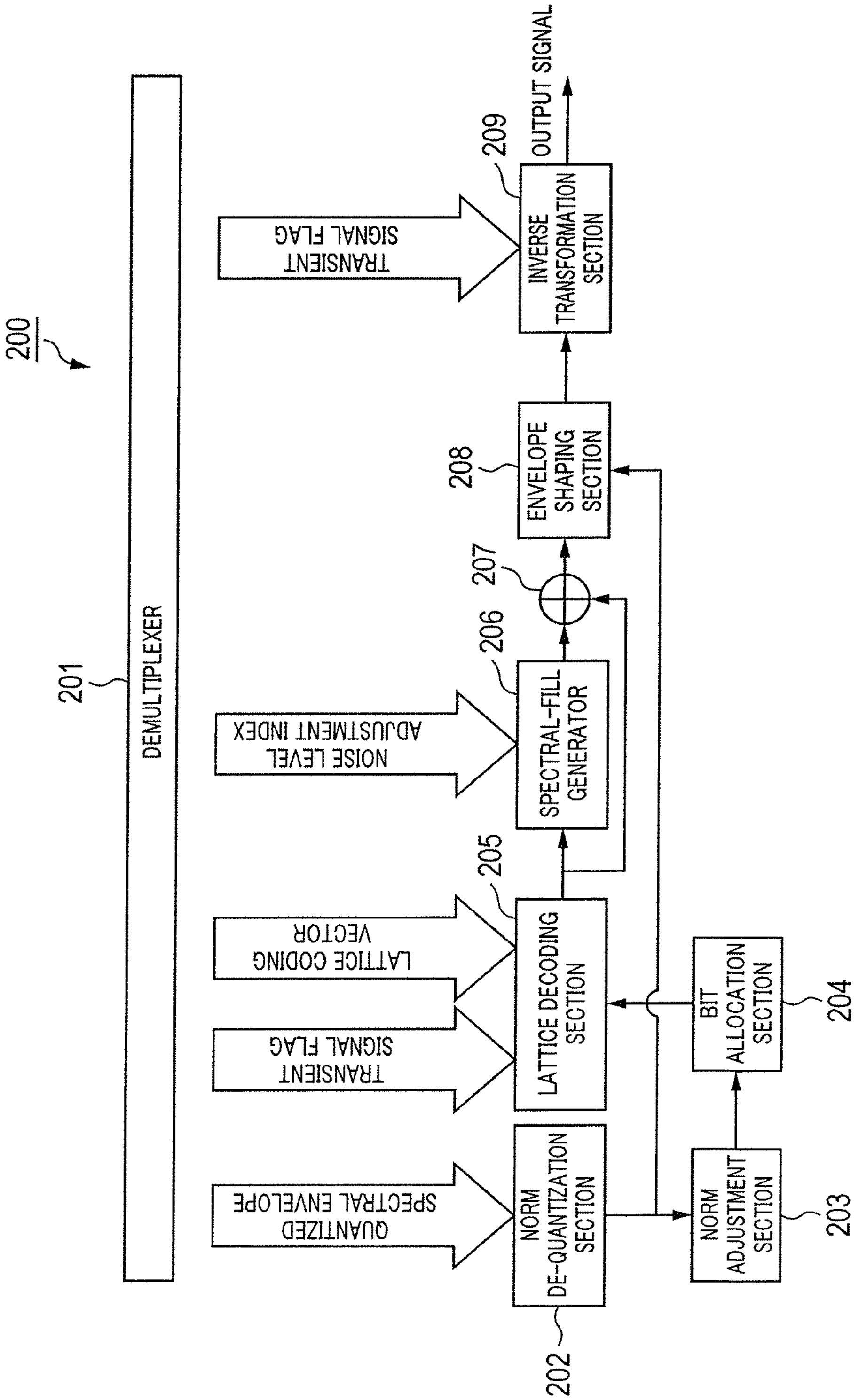
FIG. 6 is a block diagram illustrating a configuration of a speech/audio decoding apparatus according to an embodiment of the present invention.

FIG. 6 is a block diagram illustrating a configuration of speech/audio decoding apparatus 200 according to an embodiment of the present invention. A bit stream transmitted from speech/audio coding apparatus 100 is received by speech/audio decoding apparatus 200 and demultiplexed by demultiplexer 201.

Norm de-quantization section 202 de-quantizes the quantized spectral envelope (that is, norm) outputted from the multiplexer, obtains a spectral envelope made up of norms of all bands and outputs the spectral envelope obtained to norm adjustment section 203.

Norm adjustment section 203 adjusts the spectral envelope outputted from norm de-quantization section 202 based on adaptive spectral weighting and outputs the adjusted spectral envelope to bit allocation section 204.

Bit allocation section 204 allocates available bits for each band in a frame using the spectral envelope outputted from norm adjustment section 203. That is, bit allocation section 204 recalculates bit allocation indispensable to decode the lattice-vector code of the normalized spectral coefficient. The allocated bits are outputted to lattice decoding section 205.

Lattice decoding section 205 decodes the lattice coding vector outputted from demultiplexer 201 based on a frame configuration indicated by the transient signal flag outputted from demultiplexer 201 and the bits outputted from bit allocation section 204 and acquires a spectral coefficient. The spectral coefficient is outputted to spectral-fill generator 206 and adder 207.

Spectral-fill generator 206 regenerates a low-frequency spectral coefficient to which no bit has been allocated using a codebook created based on the spectral coefficient outputted from lattice decoding section 205. Spectral-fill generator 206 adjusts the level of the regenerated spectral coefficient using the noise level adjustment index outputted from demultiplexer 201. Furthermore, spectral-fill generator 206 regenerates the spectral coefficient not subjected to high-frequency coding using a low-frequency coded spectral coefficient. The level-adjusted low-frequency spectral coefficient and regenerated high-frequency spectral coefficient are outputted to adder 207.

Adder 207 adds up the spectral coefficient outputted from lattice decoding section 205 and the spectral coefficient outputted from spectral-fill generator 206, generates a normalized spectral coefficient and outputs the normalized spectral coefficient to envelope shaping section 208.

Envelope shaping section 208 applies the spectral envelope outputted from norm de-quantization section 202 to the normalized spectral coefficient generated by adder 207 and generates a full-band spectral coefficient (corresponding to the decoded spectrum). The full-band spectral coefficient generated is outputted to inverse transformation section 209.

Inverse transformation section 209 applies inverse transform such as inverse modified discrete cosine transform (IMDCT) to the full-band spectral coefficient outputted from envelope shaping section 208, transforms it to a time-domain signal and outputs an output signal. Here, inverse transform with high-frequency resolution is applied to a case of a stationary frame and inverse transform with low-frequency resolution is applied to a case of a transient frame.

Next, the details of bit allocation section 107 will be described using FIG. 7. Note that bit allocation section 107 of speech/audio coding apparatus 100 is identical in configuration to bit allocation section 204 of speech/audio decoding apparatus 200, and therefore only bit allocation section 107 will be described and description of bit allocation section 204 will be omitted here.

Figure 7:
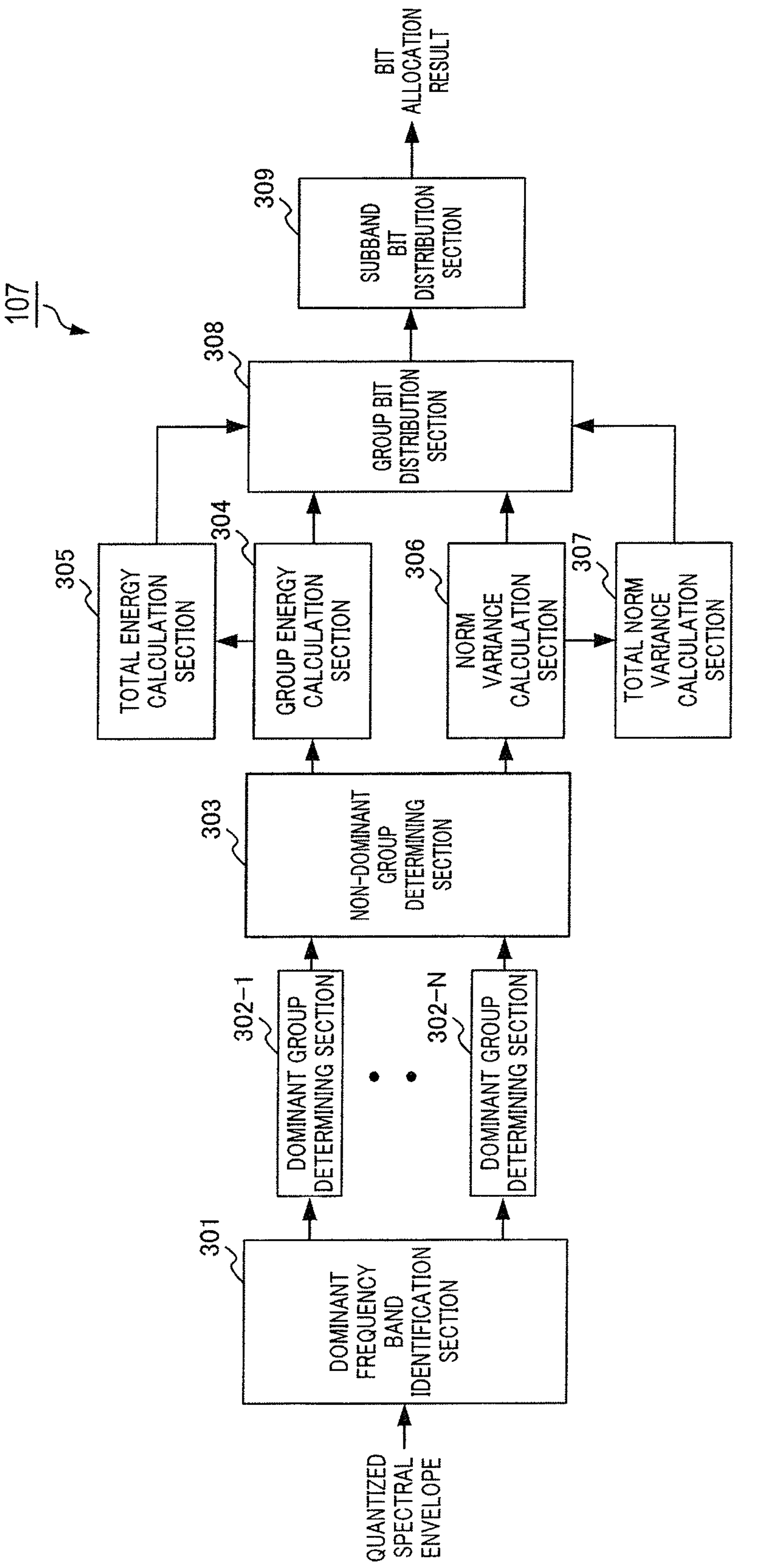
FIG. 7 is a block diagram illustrating an internal configuration of the bit allocation section shown in FIG. 5.

FIG. 7 is a block diagram illustrating an internal configuration of bit allocation section 107 shown in FIG. 5. Dominant frequency band identification section 301 identifies, based on the quantized spectral envelope outputted from norm adjustment section 106, a dominant frequency band which is a subband in which a norm coefficient value in the spectrum has a local maximum value, and outputs each identified dominant frequency band to dominant group determining sections 302-1 to 302N. In addition to designating a frequency band for which a norm coefficient value has a local maximum value, examples of the method of determining a dominant frequency band may include designating, a band among all subbands in which a norm coefficient value has a maximum value as a dominant frequency band or designating as a dominant frequency band, a band having a norm coefficient value exceeding a predetermined threshold or a threshold calculated from norms of all subbands.

Dominant group determining sections 302-1 to 302N adaptively determine group widths according to input signal characteristics centered on the dominant frequency band outputted from dominant frequency band identification section 301. More specifically, the group width is defined as the width of a group of subbands centered on and on both sides of the dominant frequency band up to subbands where a descending slope of the norm coefficient value stops. Dominant group determining sections 302-1 to 302N determine frequency bands included in group widths as dominant groups and output the determined dominant groups to non-dominant group determining section 303. Note that when a dominant frequency band is located at an edge (end of an available frequency), only one side of the descending slope is included in the group.

Non-dominant group determining section 303 determines continuous subbands outputted from dominant group determining sections 302-1 to 302N other than the dominant groups as non-dominant groups without dominant frequency bands. Non-dominant group determining section 303 outputs the dominant groups and the non-dominant groups to group energy calculation section 304 and norm variance calculation section 306.

Group energy calculation section 304 calculates group-specific energy of the dominant groups and the non-dominant groups outputted from non-dominant group determining section 303 and outputs the calculated energy to total energy calculation section 305 and group bit distribution section 308. The group-specific energy is calculated by following equation 1.

[1]

$$\text{Energy}(G(k))=\Sigma_{i=1}^{M}\text{Norm}(i) \quad \text{(Equation 1)}$$

Here, k denotes an index of each group, Energy(G(k)) denotes energy of group k, i denotes a subband index of group 2, M denotes the total number of subbands of group k and Norm(i) denotes a norm coefficient value of subband i of group n.

Total energy calculation section 305 adds up all group-specific energy outputted from group energy calculation section 304 and calculates total energy of all groups. The total energy calculated is outputted to group bit distribution section 308. The total energy is calculated by following equation 2.

[2]

$$\text{Energy}_{total}=\Sigma_{k=1}^{N}\text{Energy}(G(k)) \quad \text{(Equation 2)}$$

Here, $\text{Energy}_{total}$ denotes total energy of all groups, N denotes the total number of groups in a spectrum, k denotes an index of each group, and Energy(G(k)) denotes energy of group k.

Norm variance calculation section 306 calculates group-specific norm variance for the dominant groups and the non-dominant groups outputted from non-dominant group determining section 303, and outputs the calculated norm variance to total norm variance calculation section 307 and group bit distribution section 308. The group-specific norm variance is calculated by following equation 3.

[3]

$$\mathrm{Norm}_{var}(G(k))=\mathrm{Norm}_{max}(G(k))-\mathrm{Norm}_{min}(G(k)) \quad \text{(Equation 3)}$$

Here, k denotes an index of each group, $\mathrm{Norm}_{var}(G(k))$ denotes a norm variance of group k, $\mathrm{Norm}_{max}(G(k))$ denotes a maximum norm coefficient value of group k, and $\mathrm{Norm}_{min}(G(k))$ denotes a minimum norm coefficient value of group k.

Total norm variance calculation section 307 calculates a total norm variance of all groups based on the group-specific norm variance outputted from norm variance calculation section 306. The calculated total norm variance is outputted to group bit distribution section 308. The total norm variance is calculated by following equation 4.

[4]

$$\mathrm{Norm}_{vartotal}={}_{k=1}^{N}\mathrm{Norm}_{var}(G(k)) \quad \text{(Equation 4)}$$

Here, $\mathrm{Norm}_{vartotal}$ denotes a total norm variance of all groups, N denotes the total number of groups in a spectrum, k denotes an index of each group, and $\mathrm{Norm}_{var}(G(k))$ denotes a norm variance of group k.

Group bit distribution section 308 (corresponding to a first bit allocation section) distributes bits on a group-by-group basis based on group-specific energy outputted from group energy calculation section 304, total energy of all groups outputted from total energy calculation section 305, group-specific norm variance outputted from norm variance calculation section 306 and total norm variance of all groups outputted from total norm variance calculation section 307, and outputs bits distributed on a group-by-group basis to subband bit distribution section 309. Bits distributed on a group-by-group basis are calculated by following equation 5.

[5]

$$\mathrm{Bits}(G(k)) = Bits_{total}\times\left(\mathrm{scale1}\times\frac{\mathrm{Energy}(G(k))}{Energy_{total}}+(1-scale1)\times\frac{Norm_{var}(G(k))}{Norm_{vartotal}}\right) \quad \text{(Equation 5)}$$

Here, k denotes an index of each group, Bits(G(k)) denotes the number of bits distributed to group k, $\mathrm{Bits}_{total}$ denotes the total number of available bits, scale1 denotes the ratio of bits allocated by energy, Energy(G(k)) denotes energy of group k, $\mathrm{Energy}_{total}$ denotes total energy of all groups, and Normvar(G(k)) denotes a norm variance of group k.

Furthermore, scale1 in equation 5 above takes on a value within a range of [0, 1] and adjusts the ratio of bits allocated by energy or norm variance. The greater the value of scale1, the more bits are allocated by energy, and in an extreme case, if the value is 1, all bits are allocated by energy. The smaller the value of scale1, the more bits are allocated by norm variance, and in an extreme case, if the value is 0, all bits are allocated by norm variance.

By distributing bits on a group-by-group basis as described above, group bit distribution section 308 can distribute more bits to dominant groups and distribute fewer bits to non-dominant groups.

Thus, group bit distribution section 308 can determine the perceptual importance of each group by energy and norm variance and enhance dominant groups more. The norm variance matches a masking theory and can determine the perceptual importance more accurately.

Subband bit distribution section 309 (corresponding to a second bit allocation section) distributes bits to subbands in each group based on group-specific bits outputted from group bit distribution section 308 and outputs the bits allocated to group-specific subbands to lattice-vector coding section 108 as the bit allocation result. Here, more bits are distributed to perceptually important subbands and fewer bits are distributed to perceptually less important subbands. Bits distributed to each subband in a group are calculated by following equation 6.

[6]

$$Bits_{G(k)sb(i)}=\mathrm{Bits}(G(k))\times\frac{\mathrm{Norm}(i)}{\mathrm{Energy}(G(k))} \quad \text{(Equation 6)}$$

Here, $\mathrm{Bits}_{G(k)sb(i)}$ denotes a bit allocated to subband i of group k, i denotes a subband index of group k, $\mathrm{Bits}_{(G(k))}$ denotes a bit allocated to group k, Energy(G(k)) denotes energy of group k, and Norm(i) denotes a norm coefficient value of subband i of group k.

Figure 8A:
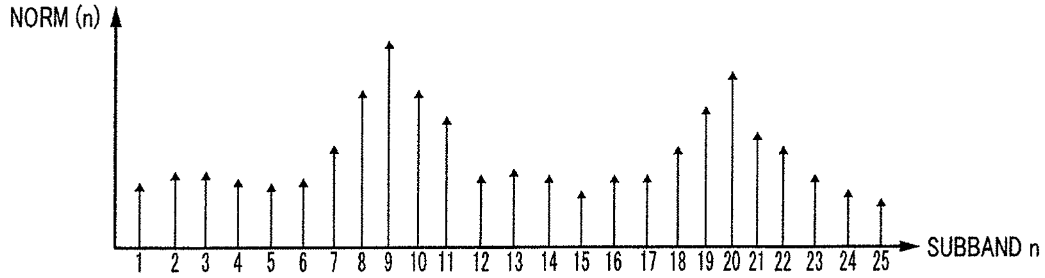
FIGS. 8A to 8C are diagrams provided for describing a grouping method according to an embodiment of the present invention.
Figure 8B:
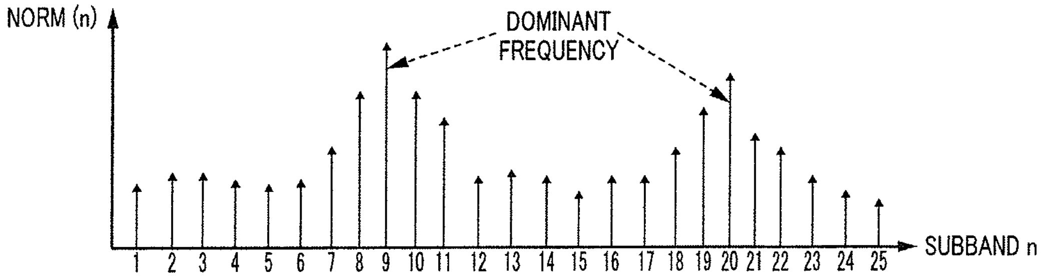
Figure 8C:
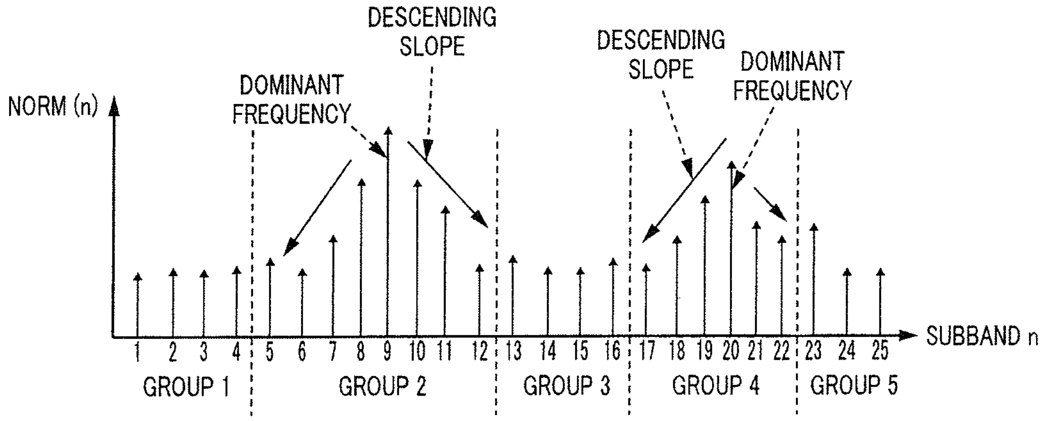

Next, a grouping method will be described using FIGS. 8A to 8C. Suppose that a quantized spectral envelope shown in FIG. 8A is inputted to peak frequency band identification section 301. Peak frequency band identification section 301 identifies dominant frequency bands 9 and 20 based on the inputted quantized spectral envelope (see FIG. 8B).

Dominant group generation sections 302-1 to 302-N determine subbands centered on and on both sides of dominant frequency bands 9 and 20 up to subbands where a descending slope of the norm coefficient value stops as an identical dominant group. In examples in FIGS. 8A to 8C, as for dominant frequency band 9, subbands 6 to 12 are determined as dominant group (group 2), while as for dominant frequency band 20, subband 17 to 22 are determined as dominant group (group 4) (see FIG. 8C).

Non-dominant group determining section 303 determines continuous frequency bands other than the dominant groups as non-dominant groups without the dominant frequency bands. In the example in FIGS. 8A to 8C, subbands 1 to 5 (group 1), subbands 13 to 16 (group 3) and subbands 23 to 25 (group 5) are determined as non-dominant groups respectively (see FIG. 8C).

As a result, the quantized spectral envelopes are split into five groups, that is, two dominant groups (groups 2 and 4) and three non-dominant groups (groups 1, 3 and 5).

Using such a grouping method, it is possible to adaptively determine group widths according to input signal characteristics. According to this method, the speech/audio decoding apparatus also uses available quantized norm coefficients, and therefore additional information need not be transmitted to the speech/audio decoding apparatus.

Figure 9:
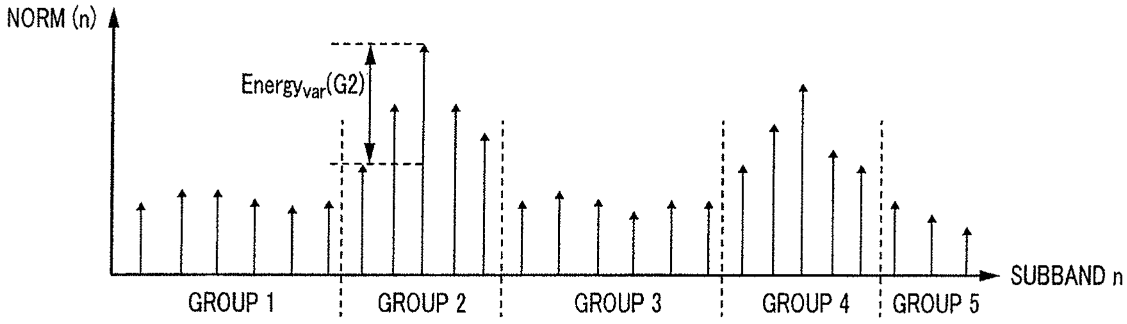
FIG. 9 is a diagram illustrating a norm variance.

Note that norm variance calculation section 306 calculates a group-specific norm variance. In the examples in FIGS. 8A to 8C, norm variance $\mathrm{Energy}_{var}(G(2))$ in group 2 is shown in FIG. 9 as a reference.

Next, the perceptual importance will be described. A spectrum of a speech/audio signal generally includes a plurality of peaks (mountains) and valleys. A peak is made up of a spectrum component located at a dominant frequency of the speech/audio signal (dominant sound component). The peak is perceptually very important. The perceptual importance of the peak can be determined by a difference between energy of the peak and energy of the valley, that is, by a norm variance. Theoretically, when a peak has sufficiently large energy compared to neighboring frequency bands, the peak should be encoded with a sufficient number of bits, but if the peak is encoded with an insufficient number of bits, coding noise that mixes in becomes outstanding, causing sound quality to deteriorate. On the other hand, a valley is not made up of any dominant sound component of a speech/audio signal and is perceptually not important.

According to the frequency band grouping method of the present embodiment, a dominant frequency band corresponds to a peak of a spectrum and grouping frequency bands means separating peaks (dominant groups including dominant frequency bands) from valleys (non-dominant groups without dominant frequency bands).

Group bit distribution section 308 determines perceptual importance of a peak. In contrast to the G.719 technique in which perceptual importance is determined only by energy, the present embodiment determines perceptual importance based on both energy and norm (energy) distributions and determines bits to be distributed to each group based on the determined perceptual importance.

In subband bit distribution section 309, when a norm variance in a group is large, this means that this group is one of peaks, the peak is perceptually more important and a norm coefficient having a maximum value should be accurately encoded. For this reason, more bits are distributed to each subband of this peak. On the other hand, when a norm variance in a group is very small, this means that this group is one of valleys, and the valley is perceptually not important and need not be accurately encoded. For this reason, fewer bits are distributed to each subband of this group.

Thus, the present embodiment identifies a dominant frequency band in which a norm coefficient value in a spectrum of an input speech/audio signal has a local maximum value, groups all subbands into dominant groups including a dominant frequency band and non-dominant groups not including any dominant frequency band, distributes bits to each group based on group-specific energy and norm variances, and further distributes the bits distributed on a group-by-group basis to each subband according to a ratio of a norm to energy of each group. In this way, it is possible to allocate more bits to perceptually important groups and subbands and perform an efficient bit distribution. As a result, sound quality can be improved.

Note that the norm coefficient in the present embodiment represents subband energy and is also referred to as "energy envelope."

The disclosure of Japanese Patent Application No. 2012-272571, filed on Dec. 13, 2012, including the specification, drawings and abstract is incorporated herein by reference in its entirety.

The speech/audio coding apparatus, speech/audio decoding apparatus, speech/audio coding method and speech/audio decoding method according to the present invention are applicable to a radio communication terminal apparatus, radio communication base station apparatus, telephone conference terminal apparatus, video conference terminal apparatus and voice over Internet protocol (VoIP) terminal apparatus or the like.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A speech or audio coding apparatus comprising:
- a transformation section that transforms an input signal from a time domain to a frequency domain to obtain a frequency spectrum comprising spectral coefficients;
- an estimation section that estimates an energy envelope which represents an energy level for each subband of a plurality of subbands achieved by splitting the frequency spectrum of the input signal, each subband having at least two spectral coefficients;
- a quantization section that quantizes the energy envelope to obtain a quantized energy envelope;
- a group determining section that splits the quantized energy envelopes into a plurality of groups, each group having a plurality of at least two subbands;
- a first bit allocation section that allocates bits to each group of the plurality of groups to obtain a group-specific number of bits for each group of the plurality of groups;
- a second bit allocation section that allocates, for each group of the plurality of groups, the group-specific number of bits allocated to a respective group of the plurality of groups to the plurality of subbands belonging to the respective group; and
- a coding section that encodes, for each subband of the plurality of subbands, the spectral coefficients included in the respective subband using bits allocated to the respective subbands.

2. The speech or audio coding apparatus according to claim 1, further comprising a dominant frequency band identification section that identifies a dominant frequency band which is a subband in which the energy envelope of the frequency spectrum exhibits a local maximum value, wherein
- the group determining section determines the dominant frequency band and subbands on both sides of the dominant frequency band each forming a descending slope of the energy envelope as dominant groups and determines continuous subbands other than the dominant frequency band as non-dominant groups.

3. The speech or audio coding apparatus according to claim 1, further comprising:
- an energy calculation section that calculates a group-specific energy; and
- a distribution calculation section that calculates a group-specific energy envelope distribution, wherein
- the first bit allocation section allocates, based on the calculated group-specific energy and the group-specific energy envelope distribution, more bits to a group when at least one of the energy and the energy envelope distribution is greater and allocates fewer bits to a group when at least one of the energy and the energy envelope distribution is smaller.

4. The speech or audio coding apparatus according to claim 1, wherein the second bit allocation section allocates more bits to a subband comprising a greater energy envelope and allocates fewer bits to a subband comprising a smaller energy envelope.

5. The speech or audio coding apparatus according to claim 1, wherein the second bit allocation section is configured to allocate more bits to a perceptually more important subband and fewer bits to a perceptually less important subband.

6. The speech or audio coding apparatus according to claim 1, wherein the second bit allocation section is configured to allocate more bits to the subbands in a group having a higher energy variance and to allocate fewer bits to the subbands in a group having a lower energy variance.

7. The speech or audio coding apparatus according to claim 1, wherein the second bit allocation section is configured to allocate more bits to the subbands in a group having a peak in the frequency spectrum and to allocate fewer bits to the subbands in a group having a valley in the frequency spectrum.

8. The speech or audio coding apparatus according to claim 1, wherein the second bit allocation section is configured to operate based on the following equation:

$$\mathrm{Bits}_{G(k)sb(i)} = \mathrm{Bits}(G(k)) \times \frac{Norm(i)}{\mathrm{Energy}(G(k))}$$

wherein $\mathrm{Bits}_{G(k)sb(i)}$ denotes a bit allocated to a subband i of a group k, i denotes a subband index of the group k, $\mathrm{Bits}_{(G(k))}$ denotes a bit allocated to the group k, Energy (G(k)) denotes an energy of the group k, and Norm(i) denotes a subband energy value of the subband i of the group k.

9. The speech or audio coding apparatus according to claim 1, wherein the first bit allocation section is configured to allocate more bits to a dominant group and fewer bits to a non-dominant group.

10. The speech or audio coding apparatus according to claim 1, wherein the first bit allocation section is configured to allocates bits on a group-by-group basis based on a group-specific energy, a total energy of all groups, a group-specific energy variance and a total energy variance of all groups.

11. The speech or audio coding apparatus according to claim 1, wherein the first bit allocation section is configured to operate based on the following equation:

$$\mathrm{Bits}(G(k)) = \mathrm{Bits}_{total} \times \left( scale1 \times \frac{\mathrm{Energy}(G(k))}{\mathrm{Energy}_{total}} + (1 - scale1) \times \frac{Norm_{var}(G(k))}{Norm_{var\ total}} \right)$$

wherein k denotes an index of each group, Bits(G(k)) denotes a number of bits allocated to a group k, $\mathrm{Bits}_{total}$ denotes a total number of available bits, scale1 denotes a ratio of bits allocated by energy, Energy(G(k)) denotes an energy of the group k, $\mathrm{Energy}_{total}$ denotes a total energy of all groups, and Normvar(G(k)) denotes an energy variance of the group k.

12. The speech or audio coding apparatus according to claim 11, wherein a value of scale1 is between 0 and 1.

13. The speech or audio coding apparatus according to claim 1, wherein the first bit allocation section is configured to determine a perceptual importance of each group by using an energy and an energy variance of the group and to enhance a dominant group.

14. The speech or audio coding apparatus according to claim 1, wherein the first bit allocation section is configured to determine a perceptual importance of a group based on an energy of the group and an energy distribution and to determine bits to be allocated to each group based on the perceptual importance for the respective group.

15. The speech or audio coding apparatus according to claim 1, wherein the group determining section is configured to adaptively determine group widths of the plurality of groups according to a characteristic of the input signal.

16. The speech or audio coding apparatus according to claim 1, wherein the group determining section is configured to use quantized subband energies.

17. The speech or audio coding apparatus according to claim 1, wherein the group determining section is configured to separate peaks of the frequency spectrum from valleys of the frequency spectrum, wherein a peak of the frequency spectrum is located in a dominant group and a valley of the frequency spectrum is located in a non-dominant group.

18. The speech or audio coding apparatus according to claim 1, wherein the group determining section is configured to identify dominant frequency bands, in which subband energy values in the frequency spectrum of the input signal have local maximum values, and to group subbands including the dominant frequency bands into dominant groups and other subbands into non-dominant groups, wherein the first bit allocation section is configured to allocate bits to a respective group based on an energy of the respective group and an energy variance of the respective group, and wherein the second bit allocation section is configured to allocate the bits, allocated on a group-by-group basis to the respective group, to a respective subband in the respective group according to a ratio of an energy of the respective subband to an energy of the respective group.

19. The speech or audio coding apparatus according to claim 1, wherein the first bit allocation section is configured to allocate more bits to a perceptually more important group and less bits to a perceptually less important group, and wherein the second bit allocation section is configured to allocate more bits to a perceptually more important subband and less bits to a perceptually less important subband.

20. A speech or audio decoding apparatus, comprising:

a de-quantization section that de-quantizes a quantized spectral envelope to obtain a dequantized spectral envelope;

a group determining section that groups splits the quantized spectral envelope into a plurality of groups each group having a plurality of at least two subbands;

a first bit allocation section that allocates bits to each group of the plurality of groups to obtain a group-specific number of bits for each group of the plurality of groups;

a second bit allocation section that allocates, for each group of the plurality of groups, the group-specific number of bits allocated to a respective group of the plurality of groups to the plurality of subbands belonging to the respective group;

a decoding section that decodes, for each subband of the plurality of subbands, encoded spectral coefficients included in a respective subband of a speech or audio signal using the bits allocated to the respective subband to obtain a decoded frequency spectrum;

an envelope shaping section that applies the de-quantized spectral envelope to the decoded frequency spectrum to obtain a shaped spectrum; and an inverse transformation section that inversely transforms the shaped spectrum from a frequency domain to a time domain.

21. The speech or audio decoding apparatus according to claim 20, further comprising a dominant frequency band identification section that identifies a dominant frequency band which is a subband in which the energy envelope of the frequency spectrum exhibits a local maximum value, wherein the group determining section determines the dominant frequency band and subbands on both sides of the dominant frequency band each forming a descending slope of the energy envelope as dominant groups and determines continuous subbands other than the dominant frequency band as non-dominant groups.

22. The speech or audio decoding apparatus according to claim 20, further comprising:

an energy calculation section that calculates a group-specific energy; and a distribution calculation section that calculates a group-specific energy envelope, wherein the first bit allocation section allocates, based on the calculated group-specific energy and the group-specific energy envelope distribution, more bits to a group when at least one of the energy and the energy envelope distribution is greater and allocates fewer bits to a group when at least one of the energy and the energy envelope distribution is smaller.

23. The speech or audio decoding apparatus according to claim 20, wherein the second bit allocation section allocates more bits to a subband comprising a greater energy envelope and allocates fewer bits to a subband comprising a smaller energy envelope.

24. A speech or audio coding method, comprising:

transforming an input signal from a time domain to a frequency domain to obtain a frequency spectrum comprising spectral coefficients;

estimating an energy envelope that represents an energy level for each subband of a plurality of subbands achieved by splitting the frequency spectrum of the input signal, each subband having at least two spectral coefficients;

quantizing the energy envelope to obtain a quantized energy envelope;

splitting the quantized energy envelopes into a plurality of groups, each group having a plurality of at least two subbands;

allocating, for each group of the plurality of groups, bits to each group of the plurality of groups to obtain a group-specific number of bits for each group of the plurality of groups;

allocating, for each group of the plurality of groups, the group-specific number of bits allocated to a respective group of the plurality of groups to the plurality of subbands belonging to the respective group; and encoding, for each subband of the plurality of subbands, the spectral coefficients included in the respective subband using bits allocated to the respective subband.

25. A speech or audio decoding method, comprising:

de-quantizing a quantized spectral envelope to obtain a dequantized spectral envelope;

splitting the quantized spectral envelope into a plurality of groups each group having a plurality of at least two subbands;

allocating bits to each group of the plurality of groups to obtain a group-specific number of bits for each group of the plurality of groups;

allocating, for each group of the plurality of groups, the group-specific number of bits allocated to a respective group of the plurality of groups to the plurality of subbands belonging to the respective group;

decoding, for each subband of the plurality of subbands, encoded spectral coefficients included in a respective subband of a speech/audio signal using the bits allocated to the respective subband to obtain a decoded frequency spectrum;

applying the de-quantized spectral envelope to the decoded frequency spectrum to obtain a shaped spectrum; and inversely transforming the shaped spectrum from a frequency domain to a time domain.

* * * * *